United States Patent [19]

Ito

[11] Patent Number: 5,773,365
[45] Date of Patent: Jun. 30, 1998

[54] FABRICATION PROCESS OF SEMICONDUCTOR DEVICE

[75] Inventor: Shinya Ito, Tokyo, Japan

[73] Assignee: NEC Corporation, Tokyo, Japan

[21] Appl. No.: 864,975

[22] Filed: May 28, 1997

[30] Foreign Application Priority Data

May 29, 1996 [JP] Japan ..................................... 8-135530

[51] Int. Cl.⁶ ...................... H01L 21/302; H01L 21/4763
[52] U.S. Cl. ......................... 438/699; 438/624; 438/633
[58] Field of Search .................................... 438/699, 624, 438/633, 626, 645, 675, 676

[56] References Cited

U.S. PATENT DOCUMENTS

| | | | |
|---|---|---|---|
| 4,617,723 | 10/1986 | Mukai | 438/600 |
| 5,055,426 | 10/1991 | Manning | 438/622 |
| 5,210,053 | 5/1993 | Yamagata | 438/675 |
| 5,358,903 | 10/1994 | Kim | 438/622 |
| 5,453,154 | 9/1995 | Thomas et al. | 438/622 |
| 5,462,893 | 10/1995 | Matsuoka et al. | 438/675 |
| 5,602,053 | 2/1997 | Zheng et al. | 438/600 |
| 5,637,534 | 6/1997 | Takeyasu et al. | 438/675 |

FOREIGN PATENT DOCUMENTS

| | | |
|---|---|---|
| 56-56654 | 5/1981 | Japan . |
| 4-186627 | 7/1992 | Japan . |
| 4-303943 | 10/1992 | Japan . |

*Primary Examiner*—John Niebling
*Assistant Examiner*—Michael S. Lebentritt
*Attorney, Agent, or Firm*—Sughrue, Mion, Zinn, Macpeak & Seas, PLLC

[57] ABSTRACT

An interlayer insulation layer is formed on a semiconductor substrate and a groove of a wiring shape is formed in the interlayer insulation layer. Then, the groove is buried with conductor. A part of the conductor is covered with a mask material, and a part of the conductor not covered with the mask is etched to form a recess. Thus, a first wiring is defined at a part of the conductor under the recess, and a columnar projection to be a connecting portion of wirings is defined at a side of the recess on the first wiring. An insulation layer is buried in the recess except for the upper surface of the columnar projection. A second wiring covering at least a part of the exposed upper surface of the columnar projection is formed.

10 Claims, 6 Drawing Sheets

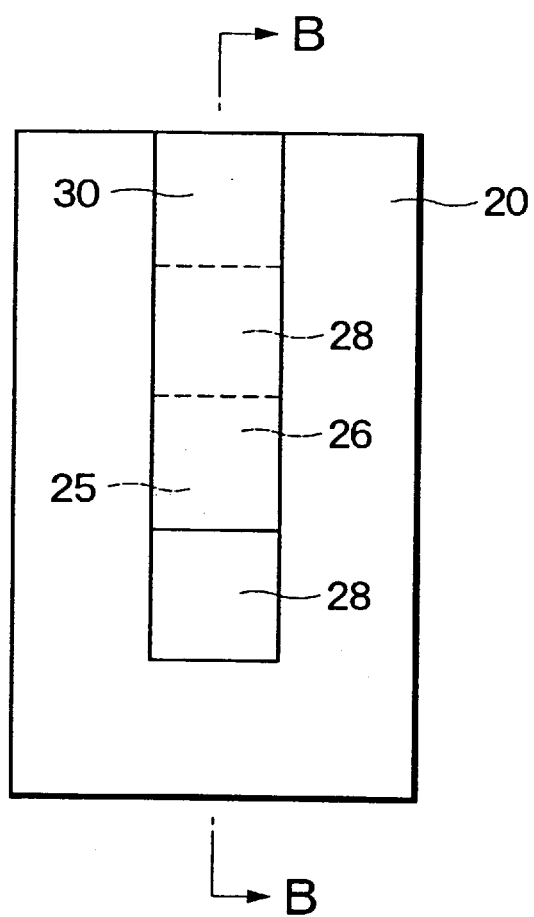

FABRICATION PROCESS OF SEMICONDUCTOR DEVICE

BACKGROUND OF THE INVENTION

1. Field of the Invention

The present invention relates generally to a fabrication process of a semiconductor device. More specifically, the invention relates to a fabrication process of a semiconductor device which can stably form a connecting portion between multilayer wirings.

2. Description of the Prior Art

A connecting portion between multilayer wirings in a semiconductor device is generally formed in such a method that a lower wiring is patterned, an interlayer dielectric is formed on the wiring, a via hole is opened in the interlayer dielectric and metal is buried in the via hole. Associating with reduction of width of the wiring and diameter of the via hole, it is becoming difficult to establish alignment between the wiring and the via hole. FIG. 1 is a section showing a conventional semiconductor device, and FIG. 2 is a plan view showing a wiring of the conventional semiconductor device. In the prior art, first, an interlayer insulation layer 2 is formed on a silicon substrate 1. Next, on the interlayer insulation layer 2, a first wiring 3 is formed by patterning. Furthermore, a silicon oxide layer 4 is formed covering the first wiring 3. A resist 5 is formed on the silicon oxide layer 4 by patterning. Then, by way of etching, a via hole 6 reaching the first wiring 3 is opened.

When the semiconductor device is fabricated by this method, the via hole 6 can be out of alignment with the first wiring 3. Then, when the via hole 6 is etched, a reaction product is deposited to interfere conduction. Also, upon subsequently burying a conductor, if tungsten (W) is grown by CVD (Chemical Vapor Deposition), for example, a side wall of the first wiring 3 can be corroded by the reaction gas. Furthermore, due to the alignment error between the via hole 6 and the first wiring 3, a contact area of the via hole 6 and the first wiring 3 is reduced to increase resistance at the via hole.

Therefore, some technologies at connecting the multilayer wirings has been proposed (Japanese Unexamined Patent Publication Nos. Show 56-56654, Hei 4-186627 and Hei 4-303943). These technologies are similar to each other. Here, discussion will be given with respect to the prior art disclosed in Japanese Unexamined Patent Publication No. Hei 4-303943. FIGS. 3A to 3G are sections showing process steps in a conventional fabrication process of a semiconductor device in sequential order.

First, as shown in FIG. 3A, an interlayer insulation layer 2 is formed on a silicon substrate 1, in which not shown elements and contacts are formed. Over the interlayer insulation layer 2, a first aluminum layer 10 is deposited in a thickness of about 2 $\mu$m. It should be noted that when the semiconductor device becomes a product at the end, the aluminum layer 10 functions as a first wiring. However, the thickness to be deposited at this step should be thicker than that required as the first wiring. Then, a resist 11 of a predetermined shape is formed on the first aluminum layer 10.

Next, as shown in FIG. 3B, with taking the resist 11 as a mask, anisotropic etching of the first aluminum layer 10 is performed. Thereafter, the resist 11 is removed.

Next, as shown in FIG. 3C, by applying a resist on the aluminum layer 10 and performing lithography, a resist 12 is formed in a region connecting the first wiring and a second wiring to be formed afterward.

Next, as shown FIG. 3D, with taking the resist 12 as a mask, anisotropic etching is again performed for the first aluminum layer 10. However, when the thickness of the first aluminum layer 10 becomes about 1 $\mu$m, anisotropic etching is terminated. Thus, the first wiring 13 is formed on the interlayer insulation layer 2. A columnar projection 14 is formed as a connecting portion between the first wiring and the second wiring. Then, the resist 12 is removed.

Next, as shown in FIG. 3E, a silicon oxide layer is deposited over the entire surface to form an interlayer insulation layer 15.

Next, as shown in FIG. 3F, the interlayer insulation layer 15 is etched until the top end surface of the columnar projection 14 is exposed. It should be noted that, upon performing the etching, when the surface of the interlayer insulation layer 15 is substantially flat, etchback is performed for entire surface. On the other hand, when unevenness is formed on the surface, for example, a resist or so forth is applied to make the surface flat and subsequently etching back is performed.

Next, as shown in FIG. 3G, a second aluminum layer 16 is deposited in a thickness of about 1 $\mu$m over the entire surface. With taking a not shown resist of a predetermined shape as a mask, anisotropic etching is performed to the second wiring 17. Thus, the first wiring 13 and the second wiring 17 are electrically connected through the columnar projection 14.

However, in such prior art, application of resist and lithographic process for forming the connecting portion 14 is performed for the interlayer insulation layer 2 and the isolated first aluminum layer 10 to be the first wiring 13, having a step. In this case, the resist layer thickness formed on the upper surface of the first aluminum layer 10 located at high position becomes thinner than the resist layer thickness formed on the upper surface of the interlayer insulation layer 2 deposited on a pad and a power source line formed on the silicon substrate 1 at the lower position than the first aluminum layer 10. Therefore, depending upon the shape of the first wiring 13, the condition in the lithographic process, such as exposure period and the like, has to be varied. Furthermore, since the resist per se formed on the first aluminum layer 10 has a thin layer thickness, it may not bear etching.

SUMMARY OF THE INVENTION

It is an object of the present invention to provide a fabrication process of a semiconductor device having a multilayer wirings structure, which can stably form a connecting portion between multilayer wirings and may not cause alignment error between a wiring and a connecting portion.

A fabrication process of a semiconductor device, according to the present invention, comprises the steps of forming an interlayer insulation layer on a semiconductor substrate, forming a groove of a wiring shape in the interlayer insulation layer, burying a conductor in the groove, covering a part of the conductor with a masking material, removing a part of the conductor to form a recess with taking the masking material as a mask, thereby defining a first wiring at a lower part of the conductor under the recess and a columnar projection at a side of the recess on the first wiring, burying an insulation layer in the recess except for the upper surface of the columnar projection and forming a second wiring covering at least a part of the exposed upper surface of the columnar projection.

In the foregoing fabrication process of a semiconductor device, the masking material may have a shape provided a greater width than the width of the first wiring at the portion where the columnar projection is formed.

Also, in the fabrication process of a semiconductor, the step of burying the conductor in the groove may comprise the steps of burying a first conductor layer in the groove and burying a second conductor layer having greater etching speed than the first conductor layer on the first conductor layer in the groove, and the step of removing a part of the conductor may comprise a step of removing only the second conductor layer by way of selective etching.

Furthermore, in the fabrication process of a semiconductor device, the conductor may be one kind of metal selected from a group consisted of aluminum, copper, tungsten and polycrystalline silicon.

Furthermore, in the fabrication process of a semiconductor device, the first conductor may be one kind of metal selected from a group consisted of copper formed by electroless plating, copper formed by selective CVD, tungsten and polycrystalline silicon.

Furthermore, in the fabrication process of a semiconductor device, the second conductor layer may be one kind of metal selected from a group consisted of aluminum, copper, tungsten and polycrystalline silicon.

In the fabrication process of a semiconductor device, the step of forming the interlayer insulation layer may comprise a step of forming a interlayer insulation layer on the semiconductor substrate, and the step of forming the groove may comprise the steps of forming a resist on the interlayer insulation layer and performing anisotropic etching of the interlayer insulation layer with taking the resist as a mask.

Also, in the fabrication process of a semiconductor device, the step of burying the conductor in the groove may comprise the steps of burying a conductor layer in the groove by CVD and flattening the surface of the conductor layer at the same height as that of the interlayer insulation layer by CMP.

Furthermore, in the fabrication process of a semiconductor device, the step of burying the insulation layer in the recess may comprise the steps of forming a interlayer insulation layer over the entire surface and flattening the surface of the interlayer insulation layer at the same height as that of the interlayer insulation layer by CMP.

In the fabrication process of a semiconductor device, the step of forming the second wiring may comprise the steps of forming a conductor layer over the entire surface, forming a resist on the conductor layer and forming a second wiring by etching of the conductor layer with taking the resist as a mask.

In the present invention, since the mask for forming the columnar projection to be the connecting portion between the wirings is formed in the flat condition of the surface of the region to be covered, the connecting portion can be formed stably irrespective of the layout pattern of the first wiring.

On the other hand, by performing etching with forming the mask wider than the first wiring, the connecting portion having the same width as that of the first wiring can be formed in self-align manner. Therefore, no alignment error may be caused between the first wiring and the connecting portion. Thus, the highly reliable connecting portion with low resistance can be formed.

Also, using the mutually different kind of conductor for the connecting portion and the first wiring, and performing selective etching for only the conductor to be the connecting portion, the end point of etching can be detected easily. Therefore, the connecting portion having a predetermined height can be formed with high accuracy.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to be present invention, but are for explanation and understanding only.

In the drawings:

FIG. 6 is a plan view showing a wiring in the first embodiment of the semiconductor device according to the invention, in which a section along line B—B corresponds to FIG. 4F.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscuring the present invention.

The first embodiment of a fabrication process of a semiconductor device according to the present invention is constructed with a wiring groove forming step, a groove burying step, an insulation layer burying step and a second wiring forming step.

Figure 1:
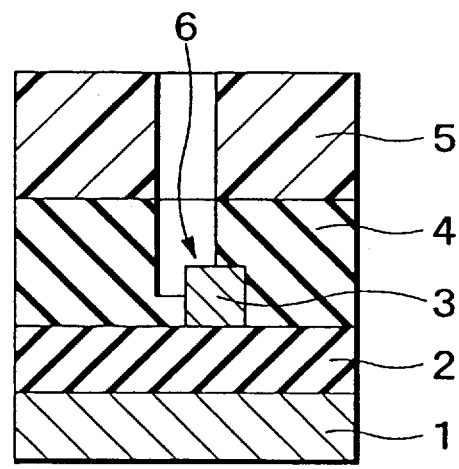
FIG. 1 is a section showing a conventional semiconductor device.
Figure 2:
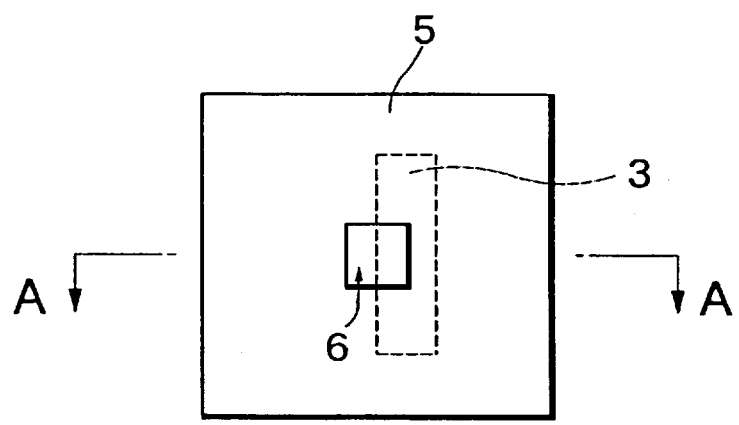
FIG. 2 is a plan view a wiring of the conventional semiconductor device, in which a section along line A—A corresponds to FIG. 1.
Figure 3A:
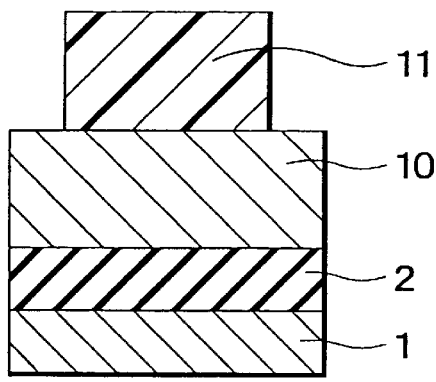
FIGS. 3A to 3G are section showing process steps in a conventional fabrication process of a semiconductor device in sequential order.
Figure 3B:
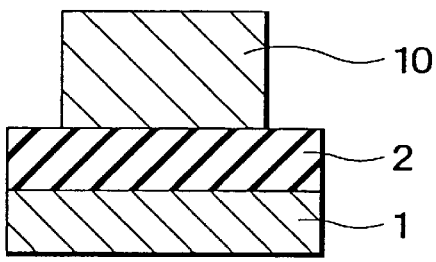
Figure 3C:
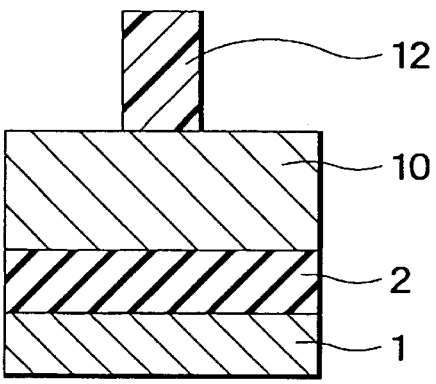
Figure 3D:
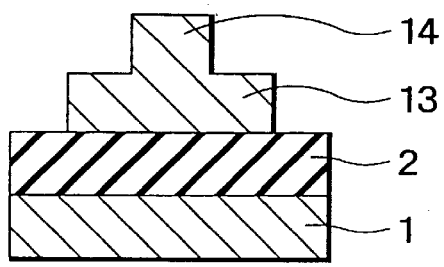
Figure 3E:
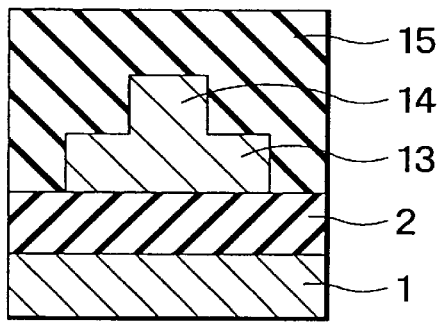
Figure 3F:
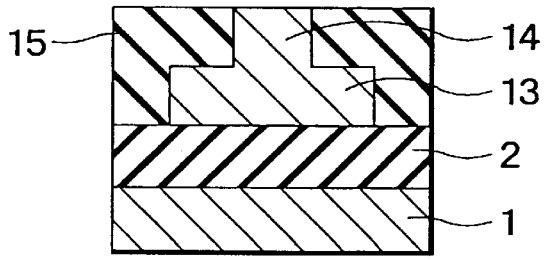
Figure 3G:
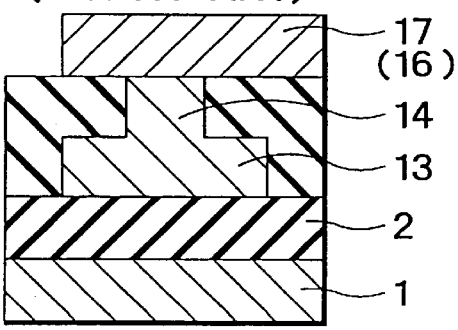
Figure 4A:
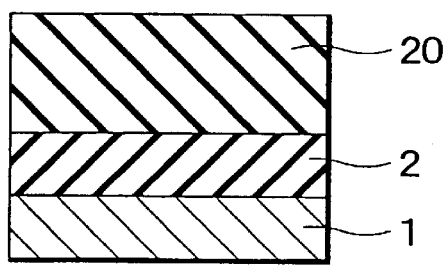
FIGS. 4A to 4F are sections showing process steps in the first embodiment of a fabrication process of a semiconductor device according to the present invention, illustrated in sequential order.

FIGS. 4A to 4F are sections showing the process steps in the first embodiment of a fabrication process of a semiconductor device according to the present invention, illustrated in sequential order. First, as shown in FIG. 4A, an interlayer insulation layer 2 is formed on a silicon substrate 1. Furthermore, a silicon oxide layer 20 is formed on the interlayer insulation layer 2 in a thickness of 2 $\mu$m, for example.

Figure 4D:
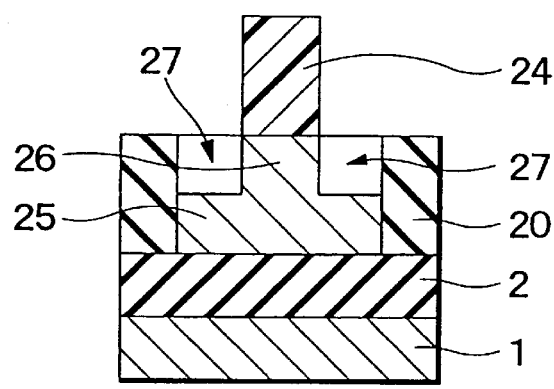
Figure 4B:
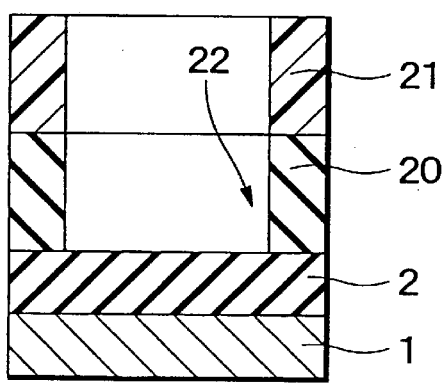

Next, as shown in FIG. 4B, a resist is applied on the silicon oxide layer 20. Then, by way of lithography, a resist 21 is formed in a region which is not a region where the first wiring is to be formed. Then, with taking the resist 21 as a mask, anisotropic etching is performed to form a groove of the same shape as that of the first wiring, namely a wiring groove 22 in the silicon oxide layer 20.

Figure 4E:
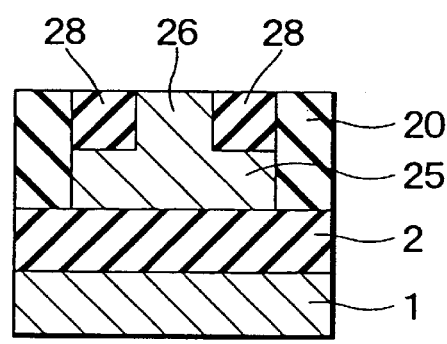
Figure 4C:
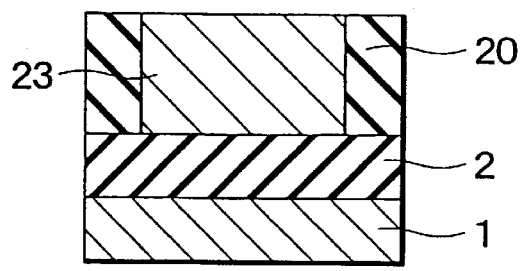

Next, as shown in FIG. 4C, the resist 21 is removed. Then, by way of CVD, for example, an aluminum layer is formed within the wiring groove 22. Then, the surface of the aluminum layer is flattened to the same height as that of the silicon oxide layer 20 by CMP (Chemical Mechanical Polishing). Thus, within the wiring groove 22, the first aluminum layer 23 is buried.

Figure 5:
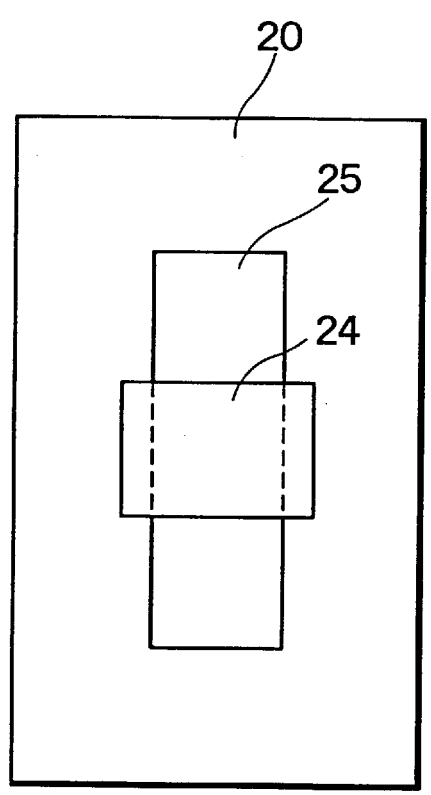
FIG. 5 is a plan view showing a resist for forming a columnar projection of the first embodiment of the semiconductor device according to the present invention.

FIG. 5 is a plan view showing a resist for forming a columnar projection of the first embodiment of the semiconductor device according to the present invention. Next, as shown in FIGS. 4D and 5, a resist is applied on the first aluminum layer 23, and a resist 24 having greater width than that of a first wiring 25 to be formed afterward is formed in a region where a connecting portion between the first wiring and a second wiring 30 to be formed afterward by way of lithography. Then, a part of the aluminum layer 23 not covered by the resist 24 is etched up to about 1 $\mu$m by way of anisotropic etching. Thus, the first wiring 25 is formed within the wiring groove 22. On the first wiring 25, a columnar projection 26 having the same width as the first wiring 25 as the connecting portion between the first wiring 25 and the second wiring 30 is formed in self-align manner.

Next, as shown in FIG. 4E, the resist 24 is removed. Then, a silicon oxide is deposited. Thereafter, the silicon oxide layer 28 having a flat surface is buried within the groove 27 on the first wiring 25 by polishing the silicon oxide until the upper surface of the columnar projection 26 is exposed by CMP and so forth.

Figure 4F:
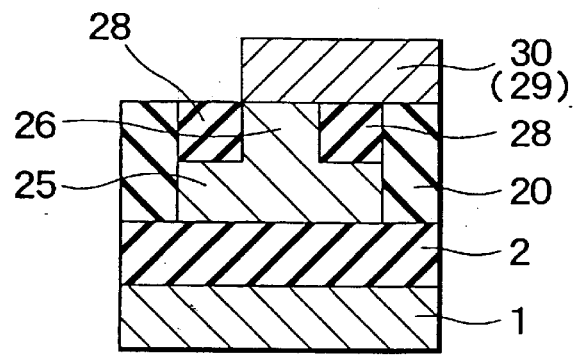

Next, as shown in FIG. 4F, the second aluminum layer 29 is deposited in a thickness of about 1 $\mu$m over the entire surface. Then, with taking a not shown resist of a predetermined shape as a mask, anisotropic etching is performed to form the second wiring 30. FIG. 6 shows a plan view showing the wiring of the first embodiment of the semiconductor device according to the present invention, in which a section along line B—B corresponds to FIG. 4F. As shown in FIGS. 4F and 6, the first wiring 25 and the second wiring 30 are electrically connected via the columnar projection 26 which has the same width as that of the first wiring 25.

In the shown embodiment, when the resist is applied in order to form the columnar projection 26 as the connecting portion between the wirings, the silicon oxide layer 20 having the same height as that of the first aluminum layer 23 has been formed around the first aluminum layer 23 to be the first wiring 25 later. Therefore, the resist layer can be formed uniformly so that the columnar projection 26 may be formed stably irrespective of the wiring pattern of the first wiring 25. Furthermore, since the wiring and the connecting portion are formed with one kind of conductor, number of the process steps can be reduced and fabrication period can be shortened.

On the other hand, since the columnar projection 26 having the same width as that of the first wiring 25 in self-align manner, alignment error between the first wiring 25 and the columnar projection 26 will not be caused and thus the connecting portion with low resistance can be formed easily.

It should be noted that the conductor to be used in the wiring or so forth should not be limited to aluminum, and copper, tungsten, polycrystalline silicon and the like can be used.

Next, discussion will be given for the second embodiment of a fabrication process of a semiconductor device according to the present invention. The second embodiment of a fabrication process of the present invention also consists of a wiring groove forming step, a groove burying step, an insulation layer burying step and a second wiring forming step, similarly to the first embodiment.

Figure 7A:
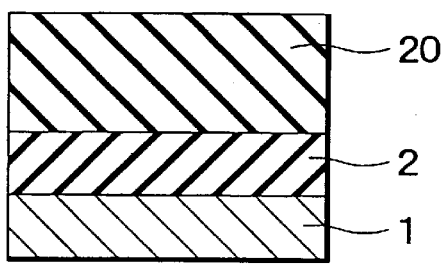
FIGS. 7A to 7F are sections showing process steps in the second embodiment of a fabrication process of a semiconductor device according to the present invention, illustrated in sequential order.

FIGS. 7A to 7F are sections showing process steps in the second embodiment of a fabrication process of a semiconductor device according to the present invention, illustrated in sequential order. First, as shown in FIG. 7A, similarly to the first embodiment, an interlayer insulation layer 2 is formed on a silicon substrate 1. Also, over the interlayer insulation layer 2, the silicon oxide layer 20 is formed in a thickness of about 2 $\mu$m.

Figure 7D:
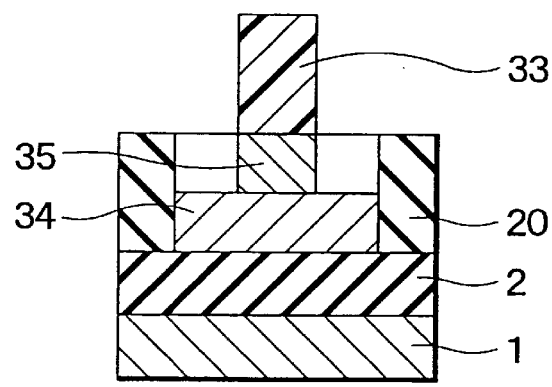
Figure 7B:
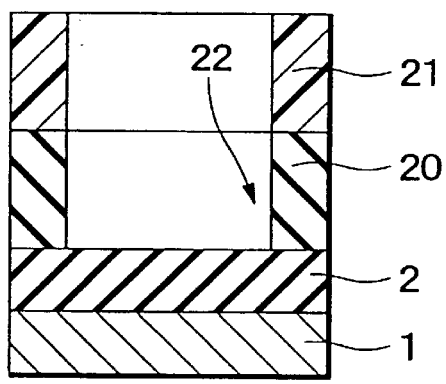

Next, as shown in FIG. 7B, a resist is applied over the silicon oxide layer 20. Thereafter, by way of lithography, a resist 21 is formed in a region which is not a region where a first wiring is to be formed. Then, with taking the resist 21 as a mask, anisotropic etching is performed for the silicon oxide layer 20 to form a groove having the shape corresponding to the first wiring, namely a wiring groove 22.

Figure 7E:
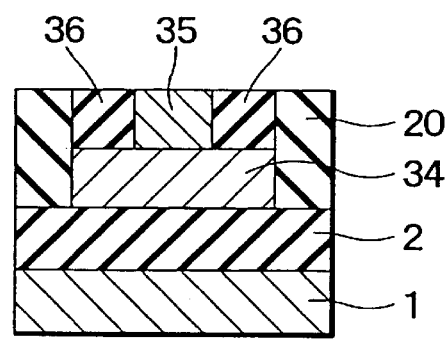
Figure 7C:
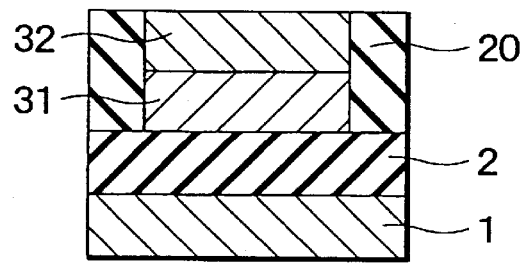

Next, as shown in FIG. 7C, the resist layer 21 is removed. Then, a copper layer 31 in a thickness of 1 $\mu$m is formed within the wiring groove 22 by way of electroless plating, for example. Thereafter, an aluminum layer is formed in a thickness of about 1 $\mu$m by way of CVD method, for example. Then, CMP is performed to polish the surface of the aluminum layer to be equal height to the silicon oxide 20 and to make the surface flat. Thus, a two layer structural body constructed with the copper layer 31 (a first conductor layer) and the first aluminum layer 32 (a second conductor layer) is buried within the wiring groove 22.

Next, as shown in FIG. 7D, over the first aluminum layer 32, a resist is applied. Then, a resist 33 is formed in a region where a connecting portion between a first wiring 34 and a second wiring 37 which are to be formed afterward by way of lithographic method. Then, anisotropic etching is performed for a part of the first aluminum layer 32 not covered with the resist 33. At this time, etching is performed under the condition to have large ratio of the etching rate between the first aluminum layer 32 and the copper layer 31. Thus, when etching reaches the copper layer 31, the etching speed becomes lowered significantly. Thus, only the first aluminum layer 32 can be selectively etched easily. In this manner, the first wiring 34 of copper is formed within the wiring groove 22. On the first wiring 34, a columnar projection 35 of aluminum serving as the connecting portion between the first wiring 31 and the second wiring 37 is formed. At the same time, a groove is formed between the columnar projection 35 on the first wiring 34 and the silicon oxide layer 20.

Next, as shown in FIG. 7E, the resist 33 is removed. Then, a silicon oxide is deposited and subsequently the silicon oxide layer 36 with flat surface is buried within the groove on the first wiring 34 by polishing the silicon oxide layer until the top end surface of the columnar projection 35 is exposed by CMP and so forth.

Figure 7F:
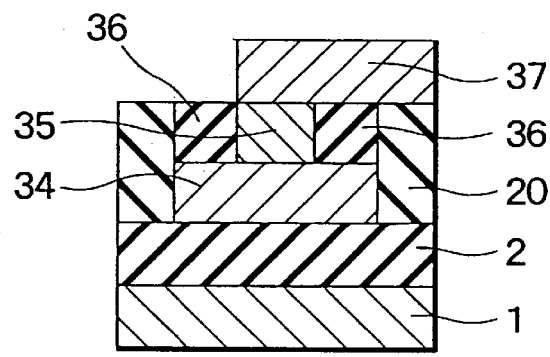

Next, as shown in FIG. 7F, over the entire surface, a second aluminum layer is deposited in a thickness of about 1 $\mu$m. Then, the second wiring 37 is formed by performing anisotropic etching with taking a not shown resist of a predetermined shape. Thus, the first wiring 34 and the second wiring 37 are electrically connected via the columnar projection 35.

In the shown embodiment, by employing the different conductors in the columnar projection 35 and the first wiring 34, and anisotropic etching is performed under the condition where the etching speed of the conductor forming the columnar projection 35 is much higher than that of the first wiring 34. Therefore, end point of etching can be easily detected. Thus, the columnar projection of the desired height and the first wiring can be formed with high accuracy.

It should be noted that the conductor to be used in the first wiring is not limited to copper formed by electroless plating method, and copper formed by selective CVD, tungsten, polycrystalline silicon and so forth may be used. Also, the conductor to be used in the columnar projection is not limited to aluminum, and copper, tungsten, polycrystalline silicon and so forth can be used.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A fabrication process of a semiconductor device comprising the steps of:
    forming an interlayer insulation layer on a semiconductor substrate;
    forming a groove of a wiring shape in said interlayer insulation layer;
    burying a conductor in said groove;
    covering a part of said conductor with a masking material;
    removing a part of said conductor to form a recess with using said masking material as a mask, thereby defining a first wiring at a lower part of said conductor under said recess and a columnar projection at a side of said recess on said first wiring;
    burying an insulation layer in said recess except for the upper surface of said columnar projection; and
    forming a second wiring covering at least a part of the exposed upper surface of said columnar projection.

2. A fabrication process of a semiconductor device as set forth in claim 1, wherein said masking material has a shape provided a greater width than the width of said first wiring at the portion where said columnar projection is formed.

3. A fabrication process of a semiconductor device as set forth in claim 1, wherein
    the step of burying said conductor in said groove comprises the steps of:
    burying a first conductor layer in said groove; and
    burying a second conductor layer having greater etching rate than said first conductor layer on said first conductor layer in said groove, and
    the step of removing a part of said conductor comprises a step of removing only said second conductor layer by way of selective etching.

4. A fabrication process of a semiconductor device as set forth in claim 1, wherein said conductor is one kind of metal selected from a group consisting of aluminum, copper, tungsten and polycrystalline silicon.

5. A fabrication process of a semiconductor device as set forth in claim 3, wherein said first conductor is one kind of metal selected from a group consisting of copper formed by electroless plating, copper formed by selective CVD, tungsten and polycrystalline silicon.

6. A fabrication process of a semiconductor device as set forth in claim 3, wherein said second conductor layer is one kind of metal selected from a group consisting of aluminum, copper, tungsten and polycrystalline silicon.

7. A fabrication process of a semiconductor device as set forth in claim 1, wherein
    the step of forming said interlayer insulation layer comprises a step of forming an interlayer insulation layer on said semiconductor substrate, and
    the step of forming said groove comprises the steps of:
    forming a resist on said interlayer insulation layer; and
    performing anisotropic etching of said interlayer insulation layer using said resist as a mask.

8. A fabrication process of a semiconductor device as set forth in claim 1, wherein the step of burying said conductor in said groove comprises the steps of:
    burying a conductor layer in said groove by CVD; and
    flattening the surface of said conductor layer at the same height as that of said interlayer insulation layer by CMP.

9. A fabrication process of a semiconductor device as set forth in claim 1, wherein the step of burying said insulation layer in said recess comprises the steps of:
    forming a interlayer insulation layer over the entire surface; and
    flattening the surface of said interlayer insulation layer at the same height as that of said interlayer insulation layer by CMP.

10. A fabrication process of a semiconductor device as set forth in claim 1, wherein the step of forming said second wiring comprises the steps of:
    forming a conductor layer over the entire surface;
    forming a resist on said conductor layer; and
    forming a second wiring by etching of said conductor layer using said resist as a mask.

* * * * *